United States Patent
Naba et al.

(10) Patent No.: US 10,515,868 B2
(45) Date of Patent: Dec. 24, 2019

(54) CIRCUIT SUBSTRATE AND SEMICONDUCTOR DEVICE

(71) Applicants: Kabushiki Kaisha Toshiba, Tokyo (JP); Toshiba Materials Co., Ltd., Kanagawa (JP)

(72) Inventors: Takayuki Naba, Chigasaki Kanagawa (JP); Hiromasa Kato, Nagareyama Chiba (JP); Masashi Umehara, Yokohama Kanagawa (JP)

(73) Assignees: Kabushiki Kaisha Toshiba, Tokyo (JP); Toshiba Materials Co., Ltd., Kanagawa-Ken (JP)

( * ) Notice: Subject to any disclaimer, the term of this patent is extended or adjusted under 35 U.S.C. 154(b) by 0 days.

(21) Appl. No.: 15/689,544

(22) Filed: Aug. 29, 2017

(65) Prior Publication Data

US 2018/0005918 A1    Jan. 4, 2018

Related U.S. Application Data

(63) Continuation of application No. PCT/JP2016/003531, filed on Aug. 1, 2016.

(30) Foreign Application Priority Data

Sep. 28, 2015   (JP) ................... 2015-189990

(51) Int. Cl.
*H01L 23/00* (2006.01)
*H01L 23/373* (2006.01)
(Continued)

(52) U.S. Cl.
CPC ...... *H01L 23/3735* (2013.01); *H01L 21/4807* (2013.01); *H05K 1/0265* (2013.01);
(Continued)

(58) Field of Classification Search
CPC ............ H01L 23/3735; H01L 21/4807; H05K 1/0271; H05K 3/388; H05K 1/0265;
(Continued)

(56) References Cited

U.S. PATENT DOCUMENTS

| 6,936,337 B2 * | 8/2005 | Tsukaguchi ......... H01L 23/3735 |
| | | 257/E23.106 |
| 8,563,869 B2 | 10/2013 | Kaga et al. |

(Continued)

FOREIGN PATENT DOCUMENTS

| CN | 101011852 A | 8/2014 |
| EP | 1921675 A1 | 5/2008 |

(Continued)

OTHER PUBLICATIONS

Extended European Search Report dated Apr. 24, 2019 in corresponding European Patent Application No. 16850544.4.

*Primary Examiner* — Vu A Vu
(74) *Attorney, Agent, or Firm* — Harness, Dickey & Pierce, PLC

(57) ABSTRACT

To improve a TCT characteristic of a circuit substrate. The circuit substrate comprises a ceramic substrate including a first and second surfaces, and first and second metal plates respectively bonded to the first and second surfaces via first and second bonding layers. A three-point bending strength of the ceramic substrate is 500 MPa or more. At least one of L1/H1 of a first protruding portion of the first bonding layer and L2/H2 of a second protruding portion of the second bonding layer is 0.5 or more and 3.0 or less. At least one of an average value of first Vickers hardnesses of 10 places of the first protruding portion and an average value of second Vickers hardnesses of 10 places of the second protruding portion is 250 or less.

21 Claims, 2 Drawing Sheets

(51) Int. Cl.
*H05K 1/02* (2006.01)
*H05K 3/38* (2006.01)
*H05K 1/03* (2006.01)
*H01L 21/48* (2006.01)
*H05K 3/06* (2006.01)

(52) U.S. Cl.
CPC ......... *H05K 1/0271* (2013.01); *H05K 1/0306* (2013.01); *H05K 3/388* (2013.01); *H05K 3/06* (2013.01); *H05K 2201/0338* (2013.01); *H05K 2201/0355* (2013.01); *H05K 2201/06* (2013.01); *H05K 2201/066* (2013.01); *H05K 2201/10272* (2013.01)

(58) Field of Classification Search
CPC ................. H05K 1/0306; H05K 3/06; H05K 2201/10272; H05K 2201/0355; H05K 2201/0338
USPC ........................................................ 257/703
See application file for complete search history.

(56) References Cited

U.S. PATENT DOCUMENTS

| 8,785,785 | B2 | 7/2014 | Kato |
| 9,101,065 | B2 | 8/2015 | Kato |
| 9,357,643 | B2 | 5/2016 | Yano et al. |
| 2009/0101392 | A1 | 4/2009 | Kaga et al. |
| 2012/0080216 | A1* | 4/2012 | Abe .................... B23K 35/3006 174/252 |
| 2012/0119349 | A1* | 5/2012 | Naba ....................... H01L 23/15 257/704 |
| 2012/0168209 | A1* | 7/2012 | Kato ....................... H01L 23/15 174/255 |
| 2012/0305304 | A1 | 12/2012 | Kato et al. |
| 2014/0291385 | A1 | 10/2014 | Kato |
| 2014/0291669 | A1 | 10/2014 | Ji et al. |

FOREIGN PATENT DOCUMENTS

| EP | 2480052 | A1 | 7/2012 |
| JP | 2004207587 | A | 7/2004 |
| JP | 2004-314161 | A | 11/2004 |
| JP | 2006-128286 | A | 5/2006 |
| JP | 2012169678 | A | 9/2012 |
| JP | 2013042165 | A | 2/2013 |
| JP | 5326278 | B2 | 10/2013 |
| JP | 2014207482 | A | 10/2014 |
| KR | 20140112029 | A | 9/2014 |
| WO | WO2007026547 | A1 | 3/2007 |
| WO | WO2011034075 | A1 | 3/2011 |
| WO | WO2013094213 | A1 | 6/2013 |

* cited by examiner

CIRCUIT SUBSTRATE AND SEMICONDUCTOR DEVICE

CROSS-REFERENCE TO RELATED APPLICATIONS

This application is a continuation of prior International Application No. PCT/JP2016/003531, filed on Aug. 1, 2016 which is based upon and claims the benefit of priority from Japanese Patent Application No. 2015-189990, filed on Sep. 28, 2015; the entire contents of all of which are incorporated herein by reference.

FIELD

Embodiments described herein generally relate to a circuit substrate and a semiconductor device.

BACKGROUND

In recent years, as industrial equipment comes to have higher performance, a power module to be mounted thereon is being made to have a higher output. With the above, a semiconductor element is being made to have a higher output. An operation guaranteed temperature of the semiconductor element is 125° C. to 150° C., but there is a possibility that the operation guaranteed temperature is raised to 175° C. or more in the future.

With rise of the operation guaranteed temperature of the semiconductor element, a high TCT characteristic is demanded of a ceramic metal circuit board. TCT stands for a thermal cycle test. The TCT is a method of measuring durability of the ceramic metal circuit board by carrying out a process of changing a temperature in order of low temperature→room temperature→high temperature→room temperature as one cycle.

A conventional ceramic metal circuit substrate has a ceramic substrate and a metal plate. The metal plate is bonded to the ceramic substrate via a bonding layer formed by using a brazing material. The bonding layer has a protruding portion which extends onto the ceramic substrate in a manner to protrude from between the ceramic substrate and the metal plate. The above-described ceramic metal circuit substrate has a high durability to the TCT of 5000 cycles. By reducing a gap of the protruding portion, the TCT characteristic can be improved. However, when the operation guaranteed temperature is 175° C. or more, improvement of the TCT characteristic by merely removing the gap of the protruding portion is limited.

A power density indicating performance of a power module is obtained by the following formula.

power density=(rated current×rated voltage×number of semiconductor elements mounted on module/volume of module The power density can be made large by increasing the number of the semiconductor elements mounted on the module or decreasing the volume of the module, for example. In order to improve these two parameters, it is required to mount a plurality of semiconductor elements on a ceramic metal circuit board. In order to realize a ceramic metal circuit board on which a plurality of semiconductor elements can be mounted and which is small in volume, it is preferable to narrow an arrangement interval between a plurality of metal plates. Also in a case of narrowing the arrangement interval between the metal plates, improvement of a TCT characteristic at a high temperature of 175° C. or more is required of the ceramic metal circuit board.

DETAILED DESCRIPTION

A circuit substrate according to an embodiment comprises: a ceramic substrate including a first surface and a second surface; a first metal plate bonded to the first surface via a first bonding layer; and a second metal plate bonded to the second surface via a second bonding layer. The first bonding layer has a first portion protruding from between the first surface and the first metal plate and extending onto the first surface. The second bonding layer has a second protruding portion protruding from between the second surface and the second metal plate and extending onto a third surface. A three-point bending strength of the ceramic substrate is 500 MPa or more. At least one of a ratio L1/H1 of a length L1 (μm) of the first portion to a thickness H1 (μm) thereof or a ratio L2/H2 of a length L2 (μm) of the second portion to a thickness H2 (μm) thereof is 0.5 or more and 3.0 or less. At least one of an average value of Vickers hardnesses of 10 places of the first portion or an average value of Vickers hardnesses of 10 places of the second portion is 250 or less.

Figure 1:
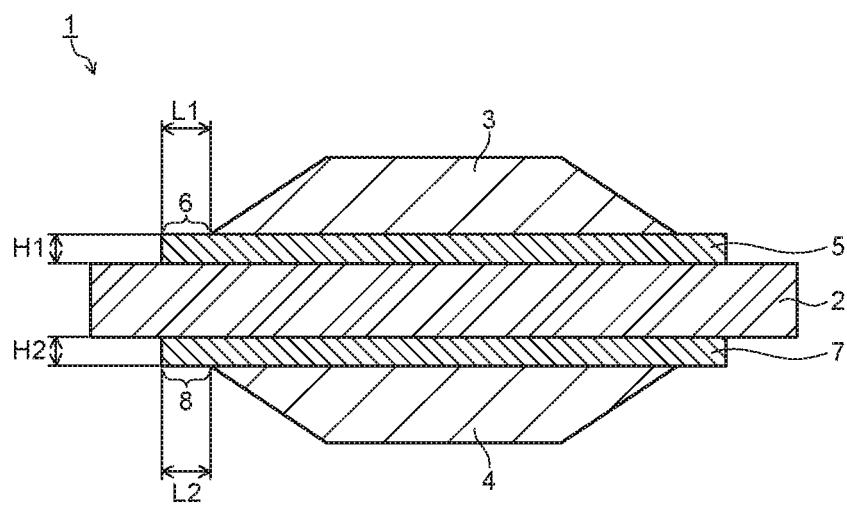
FIG. 1 is a cross-sectional schematic diagram illustrating a configuration example of a circuit substrate.

FIG. 1 is a cross-sectional schematic diagram illustrating a configuration example of a circuit substrate. The circuit substrate 1 illustrated in FIG. 1 has a ceramic substrate 2, a metal plate (front metal plate) 3, a metal plate 4 (back metal plate), a bonding layer 5, and a bonding layer 7. The bonding layer 5 has a protruding portion 6. The bonding layer 7 has a protruding portion 8.

A three-point bending strength of the ceramic substrate 2 is 500 MPa or more. By using the ceramic substrate having the three-point bending strength of 500 MPa or more, a thickness of the ceramic substrate 2 can be reduced to 0.4 mm or less. If the ceramic substrate having a three-point bending strength of less than 500 MPa is thinned to 0.4 mm or less, a TCT characteristic is reduced. In particular, durability when a temperature on a high temperature side in a TCT is 175° C. or more is reduced.

As the ceramic substrate having the three-point bending strength of 500 MPa or more, it is preferable to use a silicon nitride substrate. Three-point bending strengths of an aluminum nitride substrate and an alumina substrate are about 300 to 450 MPa in general. In contrast, the silicon nitride substrate has a high three-point bending strength of 500 MPa or more, and further, 600 MPa or more. The three-point bending strength is measured, for example, based on JIS-R-1601.

The silicon nitride substrate has a heat conductivity of 50 W/m·K or more, and further, 80 W/m·K or more. The heat conductivity is measured, for example, based on JIS-R-1611. A recent silicon nitride substrate has both high strength and high heat conductivity. The silicon nitride substrate having the three-point bending strength of 500 MPa or more and the heat conductivity of 80 W/m·K or more enables reduction of a thickness of the ceramic substrate 2 to 0.30 mm or less. Note that as the ceramic substrate 2, it is possible to use not only the silicon nitride substrate but also an aluminum nitride substrate, an alumina substrate, an alumina substrate containing zirconia, and so on which have high strengths.

The metal plate 3 is a metal circuit board for mounting a semiconductor element thereon. The metal plate 3 is bonded to a first surface of the ceramic substrate 2 via the bonding layer 5. The metal plate 4 is a heat sink plate. The metal plate 4 is bonded to a second surface of the ceramic substrate 2 via the bonding layer 7.

As the metal plates 3, 4, metal plates containing copper or aluminum or an alloy whose main component is copper or aluminum can be used. The metal plate of the above-described material, since being low in electrical resistance, is easily usable as a circuit substrate, for example. Further, a heat conductivity of copper is as high as 398 W/m·K and a heat conductivity of aluminum is as high as 237 W/m·K. Thus, heat release performance can also be improved.

Thicknesses of the metal plates 3, 4 having the above-described characteristics are preferable to be 0.6 mm or more, and further, 0.8 mm or more. Increasing the thickness of the metal plate can achieve both securing of a current-carrying capacity and improvement of heat release performance. Further, heat can be diffused not only in a thickness direction of the metal plate but also in a surface direction, so that the heat release performance can be improved. The thicknesses of the metal plates 3, 4 are preferable to be 5 mm or less. The thickness over 5 mm excessively increases a weight of the metal plate, resulting in apprehension that adjustment of sizes of the protruding portions 6, 8 becomes difficult.

The bonding layer 5 bonds the first surface of the ceramic substrate 2 and the metal plate 3. The bonding layer 6 bonds the second surface of the ceramic substrate 2 and the metal plate 4. The protruding portion 6 extends onto the first surface of the ceramic substrate 2 in a manner to protrude from between the first surface and the metal plate 3. The protruding portion 8 extends onto the second surface of the ceramic substrate 2 in a manner to protrude from between the second surface and the metal plate 4.

The bonding layers 5, 7 are formed by applying brazing material paste onto the ceramic substrate 2. On this occasion, if the metal plates 3, 4 are thick, the brazing material paste spreads too much due to weights of the metal plates 3, 4. Too much spreading of the brazing material paste increases a brazing material amount to be removed by an etching processing or the like after bonding, to cause a cost increase. Therefore, the thicknesses of the metal plates 3, 4 are preferable to be 5 mm or less, and further, 3 mm or less.

When the metal plates 3, 4 are copper plates or aluminum plates, the bonding layers 5, 7 are preferable to contain at least one element selected from Ag (silver), Cu (copper), and Al (aluminum) as a main component. Further, the bonding layers 5, 7 are preferable to further contain at least one element selected from Ti (titanium), Hf (hafnium), Zr (zirconium), Si (silicon), and Mg (magnesium). For example, the bonding layers 5, 7 may contain Ag, Cu, and at least one element selected from Ti, Zr, and Hf. Further, the bonding layers 5, 7 may contain Al and at least one element selected from Si and Mg. The bonding layer whose main component is Ag or Cu is suitable for bonding a copper plate. The copper plate has a higher heat conductivity compared with an aluminum plate, and is effective in improving heat release performance. Further, the bonding layers 5, 7 are preferable to contain at least one element selected from In (indium), Sn (tin), and C (carbon).

At least one of a ratio L1/H1 of a protruding length L1 (µm) to a thickness H1 (µm) of the protruding portion 6 and a ratio L2/H2 of a protruding length L2 (µm) to a thickness H2 (µm) of the protruding portion 8 is 0.5 or more and 3.0 or less. At least one of L1/H1 and L2/H2 being 0.5 or more and 3.0 or less indicates that the protruding length (width) is 0.5 times or more and 3.0 times or less the thickness.

In a TCT, a heat stress is applied to the protruding portions 6, 8. The heat stress becomes larger as a temperature difference between a low temperature side and a high temperature side of the TCT spreads. The protruding lengths of the protruding portions 6, 8 are small when L1/H1 and L2/H2 are less than 0.5, and thus the heat stress applied to the protruding portions 6, 8 becomes large in the thickness direction. The above causes generation of a crack inside the ceramic substrate 2 and the bonding layers 5, 7 due to the heat stress. When L1/H1 and L2/H2 are over 3.0, the heat stress applied to the protruding portions 6, 8 becomes large in a protruding length direction. The above causes generation of a crack inside the ceramic substrate 2 and the bonding layers 5, 7 due to the heat stress.

The heat stress is generated by shrinkage and expansion occurring due to the temperature difference. In order to alleviate this heat stress, it is preferable to control L1/H1 and L2/H2 to within a range of 0.5 to 3.0. By controlling L1/H1 and L2/H2, homogeneity in a direction to which the heat stress (shrinkage and expansion) is applied can be increased, and thus, the crack occurring inside the ceramic substrate 2 and the bonding layers 5, 7 can be suppressed. Consequently, the TCT characteristic can be improved. In particular, when the thicknesses of the metal plates 3, 4 are 0.6 mm or more, control of the direction to which the heat stress is applied is effective in improving the TCT characteristic. L1/H1 and L2/H2 are more preferable to be 1.0 or more and 2.0 or less.

It is preferable that at least one of average values of Vickers hardnesses of arbitrary 10 places of the protruding portion 6 and of Vickers hardnesses of arbitrary 10 places of the protruding portion 8 is 250 or less. When the average value of the Vickers hardnesses is over 250, the protruding portions 6, 8 become too hard to obtain alleviation effects of heat stress sufficiently. Further, the average value of the Vickers hardnesses is preferable to be 90 or more and 230 or less, and further, 100 or more and 170 or less.

When the average value of the Vickers hardnesses of 10 places is less than 90, the hardness of the protruding portion is insufficient. There is apprehension that excessive softness may make a deformation amount due to the heat stress larger, contrarily. The large deformation amount may bring about deterioration of the TCT characteristic.

It is preferable that at least one of a difference between a maximum value and a minimum value of Vickers hardnesses of the arbitrary 10 places of the protruding portion 6 and a difference between a maximum value and a minimum value of Vickers hardnesses of the arbitrary 10 places of the protruding portion 8 is 50 or less. Large variation of Vickers hardnesses generates partial variation of deformation amounts due to the heat stress. Thus, the variation of Vickers hardnesses is preferable to be small.

The Vickers hardness is measured based on JIS-R-1610. A load by an indenter is applied to the protruding portions 6, 8 at a load of 50 gf for a load holding time of 10 seconds. The Vickers hardness is obtained from diagonal line lengths in 2 directions of an indentation.

When measurement is difficult due to the metal plates 3, 4, the Vickers hardness is measured by using a nano indenter. If the nano indenter is used, the Vickers hardness can be measured without removing the metal plate. As the nano indenter, a nano indenter manufactured by Hysitron, Inc. can be used, for example. As the indenter, a Berkovich type diamond triangular pyramid indenter can be used, for example. With a maximum load being set to 1500 μN (micro Newton), an indentation depth at a time that the load is gradually increased over 50 seconds is measured, and a nano indentation hardness HIT is obtained. The nano indentation hardness HIT is converted into a Vickers hardness HV by using the following formula. This conversion formula is presented in a literature "Metal Vol. 78 (2008) No. 9, P. 885 to 892".

Vickers hardness $HV$ (kgf/mm$^2$)=76.23×nano indentation hardness $HIT$ (GPa)+6.3

As described above, the circuit substrate of the embodiment is a circuit substrate obtained by bonding the ceramic substrate having the three-point bending strength of 500 MPa or more and the metal plates on both surfaces thereon via the bonding layers. The bonding layer has the protruding portion, and the ratio of the protruding length to the thickness of the protruding portion is 0.5 or more and 3.0 or less, and the average value of the Vickers hardnesses of 10 places of the protruding portion is 250 or less.

Figure 2:
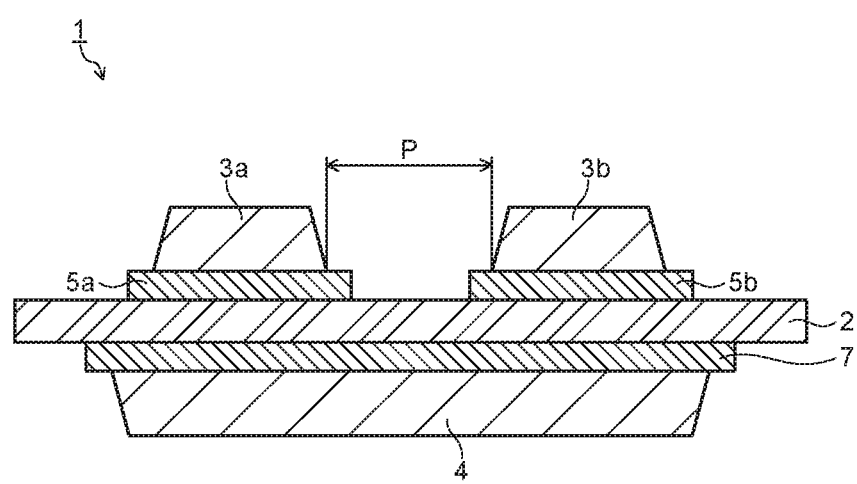
FIG. 2 is a cross-sectional schematic diagram illustrating another configuration example of the circuit substrate.

A plurality of metal plates may be bonded to at least one of the surfaces of the ceramic substrate 2. FIG. 2 is a cross-sectional schematic diagram illustrating another configuration example of the circuit substrate. A circuit substrate 1 illustrated in FIG. 2 is different compared with the circuit substrate 1 illustrated in FIG. 1 at least in configuration where a metal plate 3a and a metal plate 3b are included as the plurality of metal plates 3. Note that the circuit substrate 1 may have three or more metal plates as the plurality of metal plates 3. Note that regarding explanation of the same configuration as that of the circuit substrate 1 illustrated in FIG. 1, explanation of the circuit substrate 1 illustrated in FIG. 1 is appropriately cited.

The metal plate 3a is bonded to a first surface of a ceramic substrate 2 via a bonding layer 5a. The metal plate 3b is bonded to the first surface of the ceramic substrate 2 via a bonding layer 5b. Regarding explanation of the bonding layer 5a and the bonding layer 5b, explanation of the bonding layer 5 is appropriately cited.

Figure 3:
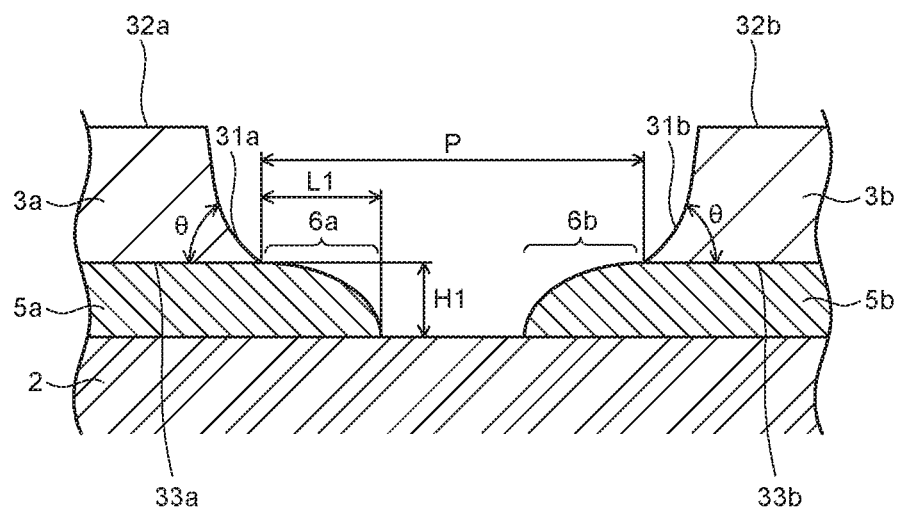
FIG. 3 is an enlarged diagram illustrating a part of the circuit substrate illustrated in FIG. 2.

FIG. 3 is an enlarged diagram illustrating a part of the circuit substrate 1 illustrated in FIG. 2. The bonding layer 5a has a protruding portion 6a extending onto the first surface of the ceramic substrate 2 in a manner to protrude from between the first surface and the metal plate 3a. The bonding layer 5b has a protruding portion 6b extending onto the first surface of the ceramic substrate 2 in a manner to protrude from between the first surface and the metal plate 3b.

In a cross section including a thickness direction of the metal plates 3, a side surface 31a of the metal plate 3 is inclined toward the edge of an outer surface 32a of the metal plate 3. A side surface 31b of the metal plate 3 is inclined toward the edge of an outer surface 32b of the metal plate 3. An angle θ made by the side surface 31a and a inner surface 33a of the metal plate 3a and an angle θ made by the side surface 31b and a inner surface 33b of the metal plate 3b are preferable to be 40 degrees or more and 84 degrees or less. By inclining the side surfaces 31a, 31b, a heat stress can be alleviated. An angle made by the side surface 31a and the outer surface 32a of the metal plate 3a and an angle made by the side surface 31b and the outer surface 32b of the metal plate 3b are preferable to be 85 degrees or more and 95 degrees or less (perpendicular or almost perpendicular). A structure illustrated in FIG. 3 is effective in particular when thicknesses of the metal plates 3a, 3b are 0.6 mm or more, and further, 0.8 mm or more.

As a result of setting the angle θ of the side surface 31a of the metal plate 3a and the angle θ of the side surface 31b of the metal plate 3b to 40 degrees or more and 84 degrees or less and setting the angle made by the side surface and the outer surface of the metal plate 3a and the angle made by the side surface and the outer surface of the metal plate 3b to 85 degrees or more and 95 degrees or less, it is possible to increase areas of flat surfaces of the metal plates 3a, 3b while alleviating a stress. Increasing the areas of the flat surfaces of the metal plates 3a, 3b can broaden a mountable area for a semiconductor element. When the mountable area for the semiconductor element can be broadened, flexibility of circuit design can be improved.

The protruding length of the protruding portion is obtained with a contact portion of the side surface of the metal plate and the protruding portion being a reference. The thickness of the protruding portion is a thickness of the thickest part of the protruding portion. For example, it is preferable that a thickness of the protruding portion 6a at a contact portion of the side surface 31a and the protruding portion 6a and a thickness of the protruding portion 6b at a contact portion of the side surface 31b and the protruding portion 6b are thickest, that the protruding portion 6a has a thickness gradient of becoming gradually thinner from the contact portion of the side surface 31a and the protruding portion 6a toward an end portion, and that the protruding portion 6b has a thickness gradient of becoming gradually thinner from the contact portion of the side surface 31b and the protruding portion 6b toward an end portion. As a result of having the thickness gradient, deformation of the protruding portion due to a heat stress can be suppressed.

A protruding length L1 of the protruding portions 6a, 6b is preferable to be 40 μm or less, and further, 25 μm or less. By controlling L1/H1 of the protruding portions 6a, 6b and a Vickers hardness HV, a stress alleviation effect can be improved. In other words, even with a protruding portion having a protruding length as short as 40 μm or less, a sufficient stress alleviation effect can be obtained.

In a case where the side surfaces 31a, 31b are inclined, as a result that a shortest distance P (shortest distance from the contact portion of the side surface 31a and the protruding portion 6a and the contact portion of the side surface 31b and the protruding portion 6b) between skirts of inclined surfaces is narrowed to 1.1 mm or less, and further, 1.0 mm or less, it becomes possible to make a circuit substrate smaller without decreasing the mountable area for a semiconductor element. Therefore, the circuit substrate illustrated in FIG. 3 is effective in a case where a plurality of metal plates are bonded to a first surface of a ceramic substrate 2. A minimum value of the shortest distance P is preferable to be 0.6 mm or more. In a case of a power module having a metal plate of 0.6 mm or more in thickness, conductivity failure may occur if the shortest distance P is less than 0.6 mm, considering a rated voltage.

The above-described circuit substrate has a high TCT characteristic. A TCT is carried out, with one cycle being −40° C.×holding for 30 minutes→room temperature×holding for 10 minutes→175° C.×holding for 30 minutes→room temperature×holding for 10 minutes, for example, by measuring the number of the cycles where a failure occurs in the circuit substrate. The failure of the circuit substrate means, for example, peeling of the bonding layers 5 (5a, 5b), 7, a crack of the ceramic substrate 2, or the like.

The circuit substrate of this embodiment can exhibit an excellent TCT characteristic even if a holding temperature on a high temperature side in the TCT is set to 175° C. or higher. The holding temperature of 175° C. or higher means, for example, 200° C. to 250° C. In a semiconductor element such as a SiC element and a GaN element, a junction temperature is estimated to become 200 to 250° C. The junction temperature corresponds to an operation guaranteed temperature of the semiconductor element. Thus, durability at a high temperature is required also of the circuit substrate.

In the circuit substrate of this embodiment, a ratio of the protruding length to the thickness of the protruding portion, and the Vickers hardness are controlled. Thereby, the TCT characteristic can be improved even in a case of the circuit substrate in which a plurality of metal plates are bonded. In particular, it is possible to make the protruding length of the protruding portion as small as 40 µm or less, and further, 25 µm or less. Therefore, the excellent TCT characteristic can be obtained even if the shortest distance P is narrowed to 1.1 mm or less, and further, 1.0 mm or less. Further, improvement of the TCT characteristic can be achieved even if the thickness of the metal plate is made as thick as 0.6 mm or more, and further, 0.8 mm or more.

The circuit substrate of this embodiment is effective as a circuit substrate for mounting a semiconductor element of a semiconductor device. Further, the circuit substrate of this embodiment is suitable also for a semiconductor device on which a plurality of semiconductor elements are mounted. In the circuit substrate according to this embodiment, since the shortest distance P between the metal plates can be made narrow, it is possible to reduce a size of a semiconductor device on which the same number of semiconductor elements are mounted. Therefore, the semiconductor device can be made smaller. Making the semiconductor device smaller leads to improvement of a power density.

Next, a manufacturing method of a circuit substrate will be described. The manufacturing method of the circuit substrate according to the embodiment is not limited in particular, but the following method is cited as a method for obtaining the circuit substrate efficiently.

First, a ceramic substrate 2 is prepared. For example, in a case where a silicon nitride substrate is prepared as the ceramic substrate 2, by using a brazing material containing Ti as a brazing material, a TiN phase (titanium nitride phase) can be formed. The TiN phase contributes to improvement of a bonding strength.

Further, metal plates 3, 4 are prepared. Regarding the metal plates 3, 4, plain plates may be bonded and patterned by etching, or metal plates having been patterned in advance may be bonded.

Further, the brazing material is prepared for forming bonding layers 5, 7. As the brazing material, a brazing material containing an element applicable to the bonding layers 5, 7 can be used. For example, in a case of the brazing material constituted by Ag, Cu, and Ti, preferable is a range where Ag is contained 40 to 80 mass %, Cu is contained 15 to 45 mass %, Ti is contained 1 to 12 mass %, and Ag+Cu+Ti=100 mass %. Further, in a case where In and Sn are added, it is preferable that at least one element selected from In and Sn are added in a range of 5 to 20 mass %. In a case where C is added, it is preferable that C is added in a range of 0.1 to 3 mass %.

In a case of a brazing material containing Ag, Cu, Ti, Sn (or In), and C, preferable is a range where Ag is contained 40 to 80 mass %, Cu is contained 15 to 45 mass %, Ti is contained 1 to 12 mass %, Sn (or In) is contained 5 to 20 mass %, C is contained 0.1 to 2 mass %, and Ag+Cu+Ti+Sn (or In)+C=100 mass %. Though compositions of the brazing material using Ti were explained here, part or all of Ti may be replaced by Zr or Hf.

In order to form bonding layers 5, 7 which contain Ag, Cu, and at least one element selected from Ti, Zr, and Hf, it is preferable to use a brazing material containing respective elements. Among active metals selected from Ti, Zr, and Hf, Ti is preferable. When a silicon nitride substrate is used as the ceramic substrate 2, Ti can form TiN to form solid bonding. It is also effective to add at least one element selected from In (indium), Sn (tin), and C (carbon) to those brazing materials.

In order to make an average value of Vickers hardnesses of the protruding portions 6, 8 be 250 or less, it is preferable to set Ag/Cu to 2.4 or less, and further, 2.1 or less in mass ratio. Further, it is more preferable to set Ag/Cu to 1.2 or more and 1.7 or less in mass ratio. Controlling Ag/Cu makes it easy to control the average value of Vickers hardnesses of the protruding portion to 250 or less.

When an Ag—Cu—Ti brazing material is used, it is possible to bond the metal plates 3, 4 to the ceramic substrate 2 by using an eutectic of Ag—Cu. The Ag—Cu eutectic contains 72 mass % Ag and 28 mass % Cu. Thus, a mass ratio Ag/Cu is 2.57. A mass ratio Ag/Cu of a normal Ag—Cu—Ti brazing material is approximately 2.57. Meanwhile, the Ag—Cu eutectic is a hard crystal. Increase of the Ag—Cu eutectic makes a bonding layer hard. Thus, hardnesses of the protruding portions 6, 8 also become high. Further, if the Ag—Cu eutectics are not formed uniformly, variation of the Vickers hardnesses also becomes large.

By setting the mass ratio of Ag/Cu to 2.4 or less, a Cu amount can be made larger than a eutectic composition. By increasing the Cu amount, the hardnesses of the protruding portions 6, 8 can be reduced. Further, it is also effective to make a brazing material contain at least one element selected from In, Sn, and C.

By the brazing material using In or Sn, bonding at a low temperature is possible (a melting point of the brazing material is lowered), and a residual stress of a bonded body can be decreased. Decrease of the residual stress is effective in improvement of heat cycle reliability of the bonded body. When a content of at least one element selected from In and Sn is less than 5 mass %, sufficient effect of addition is difficult to be obtained. Meanwhile, the content over 20 mass % leads to apprehension that the bonding layer becomes too hard.

C is effective in reducing variation of hardnesses of a bonding layer. C can control fluidity of a brazing material. By adding 0.1 to 2 mass % C to the brazing material, fluidity can be suppressed. Therefore, variation of hardnesses of the bonding layer can be made smaller. When an added amount of C is less than 0.1 mass %, an effect of addition is insufficient. Meanwhile, when the added amount of C is over 2 mass %, the bonding layer may become too hard.

Ti is preferable to be added in a range of 1 to 12 mass %, and further, 5 to 11 mass %. Ti reacts to nitrogen of a silicon nitride substrate, for example, to form a TiN (titanium nitride) phase. By forming the TiN phase, a bonding strength can be improved. Bonding strengths (peel strengths) of the metal plates 3, 4 can be made as high as 17 kN/m or more, and further, 20 kN/m or more.

When a mass ratio of Ag/Cu is 2.4 or less, a Ti amount is preferable to be set to 5 mass % or more. Increasing the Cu amount leads to reduction of the amount of the Ag—Cu eutectic, by which an alleviation effect of a heat stress can be suppressed from becoming insufficient as a result that the protruding portion becomes too hard. Meanwhile, increasing the Ti amount makes it easy to form an Ag—Ti crystal and Cu—Ti crystal at a time of heating the brazing material. Melting points of the Ag—Ti crystal and of the Cu—Ti crystal are close to each other. Therefore, setting the mass ratio Ag/Cu to 2.4 or less can prevent melting points of brazing material structures from varying due to increase of Cu. By this effect, it is possible to reduce variation of Vickers hardnesses. Further, though a case where Ti is used is explained here, the same applies to a case where Zr or Hf is used.

Next, there is prepared a brazing material paste in which the above-described components of the brazing material are mixed homogeneously. A metal component in the brazing material paste is set to 60 to 95 mass % or less. The remaining 5 to 40 mass % is accounted for by a resin binder, an organic solvent, or the like. By setting the metal component to 90 mass % or more, unevenness of coating can be made small.

Next, the brazing material paste is applied to first and second surfaces of the ceramic substrate 2, the metal plate 3 is disposed on a brazing material paste layer on the first surface, and the metal plate 4 is disposed on a brazing material paste layer on the second surface. Note that a method may be one where the brazing material paste is applied onto the metal plates 3, 4 and the ceramic substrate 2 is disposed thereon. Regions to become the protruding portions 6, 8 may be small. Further, the protruding portions 6, 8 may be formed by an etching process as will be described later.

By the above-described process is formed a circuit substrate of five layer structure of metal plate 3/blazing material paste layer (bonding layer 5)/ceramic substrate 2/blazing material paste layer (bonding layer 7)/metal plate 4.

Next, a heat bonding process is carried out. A heating temperature is in a range of 700 to 900° C., for example. Further, it is preferable to cool rapidly at a cooling rate of 5° C./min or more after heat bonding. A rapid cooling process is preferable to be carried out to a temperature of equal to or lower than a freezing point temperature of the bonding layers 5, 7. By carrying out the rapid cooling process, the bonding layers 5, 7 can be solidified early. As a result that the brazing material melted by the heating process is solidified early and becomes the bonding layers 5, 7, variation of Vickers hardnesses can be reduced.

Next, an etching process is carried out as necessary. Patterning of the metal plates 3, 4 is carried out by the etching process. Side surfaces of the metal plates 3, 4 may be inclined by the etching process. Further, protruding lengths and thicknesses of the protruding portions 6, 8 may be adjusted by the etching process. The process to etch the metal plates 3, 4 and the etching process to arrange shapes of the protruding portions 6, 8 may be the same process or different processes.

With the above-described manufacturing processes, the circuit substrate can be manufactured efficiently. Further, it is possible to mount the necessary number of semiconductor elements on the circuit substrate to manufacture a semiconductor device.

EXAMPLES

Examples 1 to 13, Comparative Examples 1 to 4

Ceramic substrates 1 to 4 having characteristics shown in Table 1 are prepared as ceramic substrates, and brazing materials shown in Table 2 are prepared as brazing materials. A quality of material in Table 1 means a material of a major component of the ceramic substrate. For example, "silicon nitride" indicates a ceramic substrate whose main component is silicon nitride. "Alumina zirconia" indicates a ceramic substrate whose main component is aluminum oxide containing $ZrO_2$ (zirconium oxide). "Alumina" indicates a ceramic substrate whose main component is aluminum oxide.

TABLE 1

| | Quality of Material | Substrate Size (Vertical Length (mm) x Horizontal Length (mm) x Thickness (mm)) | Three-Point Bending Strength (Mpa) | Heat Conductivity (W/m · K) |
| --- | --- | --- | --- | --- |
| Ceramic Substrate 1 | Silicon Nitride | 50 × 40 × 0.32 | 600 | 90 |
| Ceramic Substrate 2 | Silicon Nitride | 50 × 40 × 0.25 | 700 | 90 |
| Ceramic Substrate 3 | Alumina Zirconia | 50 × 40 × 0.32 | 520 | 20 |
| Ceramic Substrate 4 | Alumina | 50 × 40 × 0.635 | 400 | 25 |

TABLE 2

| | Brazing Material Component (mass %) | Mass Ratio (Ag/Cu) |
| --- | --- | --- |
| Brazing Material 1 | Ag(76), Cu(23), Ti(1) | 3.3 |
| Brazing Material 2 | Ag(60), Cu(25), In(10), Ti(5) | 2.4 |
| Brazing Material 3 | Ag(50), Cu(24), Sn(12), In(6), Ti(7), C(1) | 2.1 |
| Brazing Material 4 | Ag(48.5), Cu(36), Sn(7), Ti(8), C(0.5) | 1.3 |
| Brazing Material 5 | Al(99.5), Si(0.5) | — |

A front metal plate was disposed on a first surface of the ceramic substrate via a first brazing material, a back metal plate was disposed on a second surface of the ceramic substrate via a second brazing material, heat bonding was carried out at 700 to 900° C., and cooling was carried out at a cooling rate of 5° C./min or more after heat bonding. Thereafter, etching was carried out to adjust a protruding length L (μm) and a thickness H (μm) of a protruding portion, and a shortest distance P between the metal plates. Thereby, circuit substrates of Examples 1 to 13 and of Comparative Examples 1 to 4 were fabricated. Table 3 shows the ceramic substrates, first brazing materials, and second brazing materials which were used in the circuit substrates of Examples 1 to 13. Tables 3, 4 show other characteristics of the circuit substrates of Examples 1 to 13 and Comparative Examples 1 to 4. Note that copper plates were used as the metal plates of Examples 1 to 3, Examples 5 to 13, and Comparative Examples 1 to 4. An aluminum plate was used as the metal plate of Example 4.

TABLE 3

| | Ceramic Substrate | First And Second Brazing Materials | Front Metal Plate (Vertical Length (mm) × Horizontal Length (mm) × Thickness (mm)) | Number | P (mm) | Back Metal Plate (Vertical Length (mm) × Horizontal Length (mm) × Thickness (mm)) |
|---|---|---|---|---|---|---|
| Example 1 | Ceramic Substrate 1 | Brazing Material 2 | 20 × 35 × 0.8 | 2 | 1.1 | 45 × 35 × 0.6 |
| Example 2 | Ceramic Substrate 1 | Brazing Material 3 | 20 × 35 × 0.8 | 2 | 1.0 | 45 × 35 × 0.8 |
| Example 3 | Ceramic Substrate 1 | Brazing Material 4 | 10 × 35 × 0.8 | 3 | 1.0 | 45 × 35 × 0.8 |
| Example 4 | Ceramic Substrate 1 | Brazing Material 5 | 20 × 35 × 0.8 | 2 | 1.1 | 45 × 35 × 0.6 |
| Example 5 | Ceramic Substrate 2 | Brazing Material 2 | 20 × 35 × 0.8 | 2 | 1.1 | 45 × 35 × 0.6 |
| Example 6 | Ceramic Substrate 2 | Brazing Material 3 | 20 × 35 × 0.8 | 2 | 1.0 | 45 × 35 × 0.8 |
| Example 7 | Ceramic Substrate 2 | Brazing Material 3 | 10 × 35 × 0.8 | 3 | 1.0 | 45 × 35 × 0.8 |
| Example 8 | Ceramic Substrate 2 | Brazing Material 4 | 10 × 35 × 0.8 | 3 | 1.0 | 45 × 35 × 0.8 |
| Example 9 | Ceramic Substrate 2 | Brazing Material 4 | 10 × 35 × 0.8 | 3 | 0.9 | 45 × 35 × 0.8 |
| Example 10 | Ceramic Substrate 3 | Brazing Material 2 | 10 × 35 × 0.8 | 2 | 1.1 | 45 × 35 × 0.6 |
| Example 11 | Ceramic Substrate 2 | Brazing Material 3 | 20 × 35 × 0.9 | 2 | 0.9 | 45 × 35 × 0.8 |
| Example 12 | Ceramic Substrate 2 | Brazing Material 4 | 20 × 35 × 1.0 | 2 | 0.9 | 45 × 35 × 0.8 |
| Example 13 | Ceramic Substrate 2 | Brazing Material 4 | 20 × 35 × 1.0 | 2 | 0.9 | 45 × 35 × 0.8 |
| Comparative Example 1 | Ceramic Substrate 1 | Brazing Material 1 | 20 × 35 × 0.8 | 2 | 1.1 | 45 × 35 × 0.6 |
| Comparative Example 2 | Ceramic Substrate 1 | Brazing Material 2 | 20 × 35 × 0.8 | 2 | 1.1 | 45 × 35 × 0.6 |
| Comparative Example 3 | Ceramic Substrate 3 | Brazing Material 1 | 20 × 35 × 0.8 | 2 | 1.1 | 45 × 35 × 0.6 |
| Comparative Example 4 | Ceramic Substrate 4 | Brazing Material 1 | 20 × 35 × 0.8 | 2 | 1.2 | 45 × 35 × 0.6 |

Figure 4:
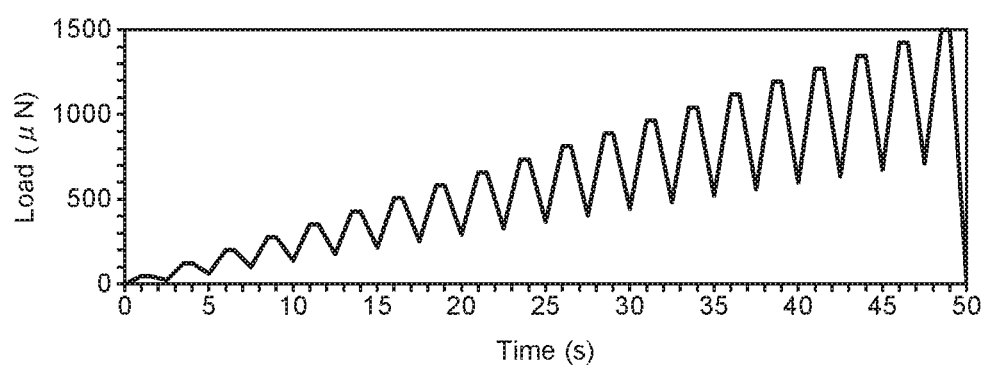
FIG. 4 is a chart illustrating a loading condition.

A Vickers hardness HV of an arbitrary protruding portion of the obtained circuit substrate was measured. In measurement of the Vickers hardness, TI 950 TriboIndenter manufactured by Hysitron, Inc. was used as a nano indenter, and a Berkovich type diamond triangular pyramid indenter was used as an indenter. FIG. 4 illustrates a load condition. In FIG. 4, a horizontal axis indicates a time (second) and a vertical axis indicates a load (A). A maximum load is 1500 μN and the load was increased gradually over 50 seconds. An indentation depth at this time was measured to obtain a nano indentation hardness HIT. The nano indentation hardness HIT was converted into a Vickers hardness HV by using the following conversion formula.

Vickers hardness $HV(kgf/mm^2) = 76.23 \times$ nano indentation hardness $HIT(GPa) + 6.3$ Vickers hardnesses HV of arbitrary 10 places were calculated and an average value thereof was obtained. Further, a difference ($HV_{max} - HV_{min}$) between a maximum value and a minimum value of the Vickers hardnesses of 10 places was obtained. Results are shown in Table 4.

TABLE 4

| | Protruding Portion | | | | | Angle θ made by Side Surface and Inner Surface of Metal Plate (degree) |
|---|---|---|---|---|---|---|
| | Protruding Length (μm) | Thickness (μm) | Protruding Length/Thickness | Average Value of HV | $HV_{max} - HV_{min}$ | |
| Example 1 | 60 | 20 | 3.0 | 240 | 70 | 50 |
| Example 2 | 40 | 20 | 2.0 | 200 | 50 | 60 |
| Example 3 | 25 | 25 | 1.0 | 160 | 40 | 70 |
| Example 4 | 15 | 30 | 0.5 | 120 | 60 | 70 |
| Example 5 | 25 | 10 | 2.5 | 240 | 70 | 80 |
| Example 6 | 30 | 15 | 2.0 | 200 | 50 | 70 |
| Example 7 | 15 | 10 | 1.5 | 200 | 50 | 60 |
| Example 8 | 20 | 20 | 1.0 | 160 | 40 | 50 |

TABLE 4-continued

| | Protruding Portion | | | | | Angle θ made by Side Surface and Inner Surface of Metal Plate (degree) |
|---|---|---|---|---|---|---|
| | Protruding Length (μm) | Thickness (μm) | Protruding Length/Thickness | Average Value of HV | $HV_{max} - HV_{min}$ | |
| Example 9 | 15 | 15 | 1.0 | 160 | 40 | 45 |
| Example 10 | 14 | 20 | 0.7 | 210 | 85 | 50 |
| Example 11 | 24 | 20 | 1.2 | 150 | 40 | 55 |
| Example 12 | 22 | 16 | 1.4 | 120 | 30 | 55 |
| Example 13 | 27 | 17 | 1.6 | 110 | 20 | 55 |
| Comparative Example 1 | 4 | 20 | 0.2 | 300 | 80 | 50 |
| Comparative Example 2 | 100 | 20 | 5.0 | 240 | 70 | 50 |
| Comparative Example 3 | 40 | 20 | 2.0 | 280 | 90 | 50 |
| Comparative Example 4 | 40 | 25 | 1.6 | 280 | 90 | 50 |

Next, regarding the circuit substrates according to Examples 1 to 13 and Comparative Examples 1 to 4, bonding strengths of arbitrary metal plates and TCT characteristics were measured. The bonding strength of the metal plate was obtained as a peel strength. More specifically, a metal terminal of 1 mm in width is bonded to the metal plate and pulled in a perpendicular direction, to measure the peel strength.

TCTs were carried out under two kinds of conditions. In a test 1, with one cycle being −40° C.×holding for 30 minutes→room temperature×holding for 10 minutes→125° C.×holding for 30 minutes→room temperature×holding for 10 minutes, existence/absence of a defect of the circuit substrate after 3000 cycles was measured. In a test 2, with one cycle being −40° C.×holding for 30 minutes→room temperature×holding for 10 minutes→250° C.×holding for 30 minutes→room temperature×holding for 10 minutes, existence/absence of a defect of the circuit substrate after 3000 cycles was measured. Existence/absence of the defect of the circuit substrate was evaluated by obtaining an area of crack occurrence between the ceramic substrate and the metal plate through scanning acoustic tomograph (SAT). The area of crack occurrence was evaluated as an index eta. Regarding the eta, 100% indicates "without a crack" and 0% indicates "cracks occurring extensively". Results thereof are shown in Table 5.

TABLE 5

| | Peel Strength (kN/m) | η (%) Test 1 | η (%) Test 2 |
|---|---|---|---|
| Example 1 | 24 | 100 | 96 |
| Example 2 | 26 | 100 | 100 |
| Example 3 | 30 | 100 | 100 |
| Example 4 | 18 | 100 | 95 |
| Example 5 | 28 | 100 | 98 |
| Example 6 | 28 | 100 | 100 |
| Example 7 | 28 | 100 | 100 |
| Example 8 | 30 | 100 | 100 |
| Example 9 | 30 | 100 | 100 |
| Example 10 | 17 | 100 | 90 |
| Example 11 | 29 | 100 | 100 |
| Example 12 | 31 | 100 | 100 |
| Example 13 | 31 | 100 | 100 |
| Comparative Example 1 | 24 | 80 | 20 |
| Comparative Example 2 | 24 | 100 | 80 |
| Comparative Example 3 | 24 | 100 | 70 |
| Comparative Example 4 | 17 | 100 | 10 |

As is known from Table 5, in the circuit substrates according to Examples 1 to 13, the peel strengths were high and the areas of crack occurrence were small (index η was large). As in the test 1, when a temperature of a high temperature side was 125° C., the areas of crack occurrence did not virtually exist. Meanwhile, as in the test 2, when the temperature was 250° C., the areas of crack occurrence became large. When durability at a high temperature is viewed, it is found that the circuit substrates according to Examples 1 to 13 are excellent.

As in Comparative Example 1, in a case of L/H of less than 0.5, the area of crack occurrence was large. As in Comparative Example 2, also in a case of L/H of over 3.0, the area of crack occurrence was large. From the above, it is found that a heat stress of the protruding portion becomes large when the temperature is high. Further, as in Comparative Example 3, also in a case of high Vickers hardness of the protruding portion, the area of crack occurrence became large.

In a case that the strength of the ceramic substrate was low as in Comparative Example 4, the area of crack occurrence was large in particular. From the above, it is found that control of L/H of the protruding portion and the Vickers hardness is an effective technology for a high-strength substrate of 500 MPa or more in three-point bending strength.

Hereinabove, several embodiments of the present invention were exemplified, but these embodiments have been presented by way of examples only, and are not intended to limit the scope of the inventions. The novel embodiments described herein can be implemented in a variety of other forms, furthermore, various omissions, substitutions and changes may be made without departing from the spirit of the inventions. Those embodiments and modification examples thereof fall within the range and basic gist of the invention and fall within the range of the invention described in what is claimed is and its equivalent. Further, the aforementioned respective embodiments can be implemented by being combined with each other.

What is claimed is:

1. A circuit substrate comprising:
a ceramic substrate including a first surface and a second surface;
a first metal plate bonded to the first surface via a first bonding layer; and
a second metal plate bonded to the second surface via a second bonding layer,
wherein the first bonding layer has a first portion protruding from between the first surface and the first metal plate and extending onto the first surface,
wherein the second bonding layer has a second portion protruding from between the second surface and the second metal plate and extending onto the second surface,
wherein at least one of the first bonding layer or the second bonding layer contains Ag, Cu, and Ti,
wherein a three-point bending strength of the ceramic substrate is 500 MPa or more,
wherein at least one of a ratio L1/H1 of a length L1 ($\mu$m) of the first portion to a thickness H1 ($\mu$m) thereof or a ratio L2/H2 of a length L2 ($\mu$m) of the second portion to a thickness H2 ($\mu$m) thereof is 0.5 or more and 3.0 or less, and
wherein at least one of an average value of first Vickers hardnesses of 10 places of the first portion or an average value of second Vickers hardnesses of 10 places of the second portion is 90 or more and 250 or less.

2. The circuit substrate according to claim 1,
wherein at least one of the average value of the first Vickers hardnesses or the average value of the second Vickers hardnesses is 90 or more and 230 or less.

3. The circuit substrate according to claim 1,
wherein at least one of the average value of the first Vickers hardnesses or the average value of the second Vickers hardnesses is 100 or more and 170 or less.

4. The circuit substrate according to claim 1,
wherein at least one of the ratio L1/H1 and the ratio L2/H2 is 1.0 or more and 2.0 or less.

5. The circuit substrate according to claim 1,
wherein the ceramic substrate is a silicon nitride substrate.

6. The circuit substrate according to claim 1,
wherein at least one of the first metal plate or the second metal plate is a copper plate,
wherein a thickness of the copper plate is 0.6 mm or more, and
wherein a thickness of the ceramic substrate is 0.4 mm or less.

7. The circuit substrate according to claim 1,
wherein at least one of the length L1 or the length L2 is 40 $\mu$m or less.

8. The circuit substrate according to claim 1,
wherein in a cross section of the first metal plate along a thickness direction thereof, a side surface of the first metal plate is inclined toward the edge of an outer surface of the first metal plate, and
wherein in a cross section including a thickness direction of the second metal plate a side surface of the second metal plate is inclined toward the edge of an outer surface of the second metal plate.

9. The circuit substrate according to claim 1,
wherein at least one of a difference between a maximum value and a minimum value of the first Vickers hardness or a difference between a maximum value and a minimum value of the second Vickers hardness is 50 or less.

10. The circuit substrate according to claim 1,
wherein each of the first and second bonding layers contains Ag, Cu, and Ti.

11. The circuit substrate according to claim 10,
wherein at least one of the first bonding layer or the second bonding layer further contains at least one element selected from the group consisting of In, Sn, and C.

12. The circuit substrate according to claim 1, comprising a plurality of the first metal plates.

13. The circuit substrate according to claim 1, comprising a plurality of the first metal plates,
wherein a shortest distance between one of the first metal plates and another one of the first metal plates is 1.1 mm or less.

14. A semiconductor device comprising
the circuit substrate according to claim 1; and
a semiconductor element mounted on the circuit substrate.

15. The semiconductor device according to claim 14, comprising
a plurality of the semiconductor elements.

16. The circuit substrate according to claim 1,
wherein the ceramic substrate is a silicon nitride substrate having a heat conductivity of 80 W/mK and a thickness of 0.30 mm or less.

17. The circuit substrate according to claim 1,
wherein at least one of the first metal plate or the second metal plate is a copper plate having a thickness of 0.6 mm or more.

18. The circuit substrate according to claim 17, comprising
a plurality of the first metal plates,
wherein the shortest distance between one of the first metal plates and another one of the first metal plates is 1.1 mm or less.

19. The circuit substrate according to claim 1,
wherein the mass ratio of cupper to silver is 2.4 or less in at least one of the first portion or the second portion.

20. The circuit substrate according to claim 19,
wherein at least one of the first metal plate or the second metal plate is a copper plate having a thickness of 0.6 mm or more.

21. The circuit substrate according to claim 20, comprising
a plurality of the first metal plates,
wherein a shortest distance between one of the first metal plates and another of the first metal plates is 1.1 mm or less.

* * * * *